United States Patent
Takeda

(10) Patent No.: US 7,359,254 B2
(45) Date of Patent: Apr. 15, 2008

(54) CONTROLLER FOR CONTROLLING A SOURCE CURRENT TO A MEMORY CELL, PROCESSING SYSTEM AND METHODS FOR USE THEREWITH

(75) Inventor: Fujio Takeda, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 295 days.

(21) Appl. No.: 11/249,963

(22) Filed: Oct. 13, 2005

(65) Prior Publication Data

US 2007/0147139 A1    Jun. 28, 2007

(51) Int. Cl.
*G11C 5/14* (2006.01)
(52) U.S. Cl. .................. 365/189.09; 365/189.11; 365/230.06
(58) Field of Classification Search ........... 365/189.09, 365/189.11, 230.06, 189.08, 190, 189.05
See application file for complete search history.

(56) References Cited

U.S. PATENT DOCUMENTS

| | | | | |
|---|---|---|---|---|
| 4,712,193 A | * | 12/1987 | Baskett | 365/190 |
| 5,768,206 A | * | 6/1998 | McClure | 365/225.7 |
| 7,110,308 B2 | * | 9/2006 | Wang | 365/189.11 |
| 7,116,598 B2 | * | 10/2006 | Shimizu et al. | 365/210 |
| 7,177,225 B2 | * | 2/2007 | Terzioglu et al. | 365/230.06 |
| 2006/0092734 A1 | * | 5/2006 | Tsuchida et al. | 365/205 |

* cited by examiner

*Primary Examiner*—Anh Phung
*Assistant Examiner*—Dang Nguyen
(74) *Attorney, Agent, or Firm*—Garlick Harrison & Markison; Bruce E. Stuckman

(57) ABSTRACT

A controller for controlling a source current of a memory cell for use in a static random access memory (SRAM) includes a bias generator for supplying a bias current to the memory cell. A read current generator controls the source current to the memory cell to a read current state when a column containing the memory cell is selected.

22 Claims, 12 Drawing Sheets

US 7,359,254 B2

CONTROLLER FOR CONTROLLING A SOURCE CURRENT TO A MEMORY CELL, PROCESSING SYSTEM AND METHODS FOR USE THEREWITH

CROSS REFERENCE TO RELATED PATENTS

Not applicable

BACKGROUND OF THE INVENTION

1. Technical Field of the Invention

The present invention relates to memory circuits such as static random access memories and related methods.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive), etc. Each of these handheld devices includes one or more integrated circuits to provide the functionality of the device. As an example, a handheld FM radio receiver may include multiple integrated circuits to support the reception and processing of broadcast radio signals in order to produce an audio output that is delivered to the user through speakers, headphones or the like. Many such integrated circuits include a processing device that executes a program that includes a sequence of instructions that are stored in a memory device such as a random access memory (RAM). These devices are typically powered from a small battery that has a limited capacity. Reduced power consumption is an important consideration for these devices in order to increase the amount of time the device can operate before the battery needs to be recharged or replaced.

FIG. 1 presents a schematic block diagram representation of a prior art RAM 240. In particular, a static RAM (SRAM) configuration is disclosed that includes an array of individual memory cells such as memory cell 206, that store binary values and that are arranged in a row and column format for ease in binary addressing. A particular memory cell, such as memory cell 206, is accessed by decoding the address 210 with row decoder 200 and column decoder 202. Row decoder 200 selects the particular wordline 212 that corresponds to the row of memory cells that contains memory cell 206. Column decoder 202 selects the particular complementary bitlines 214 and 216, driven by bitline conditioner 204, that correspond to the column of memory cells that contains memory cell 206. Column multiplexer (MUX) 208 couples the selected bitlines 214 and 216 to sense amplifier 224 and data buffer 226. Data are written to individual memory cells from data in line 222 and data buffer 226. Data are read from individual memory cells by sense amplifier 224 and are output on data out line 220.

FIG. 2 presents a graphical representation of the voltage of complementary bitlines 214 and 216 in response to a read operation. During a read operation, bit conditioner 204 precharges the bitlines 214 and 216 to a "high" voltage state. Wordline 212, corresponding to the row of memory cells that contains memory cell 206, is pulsed high, causing the voltage on one of the bitlines 214 or 216 to fall (depending on whether a 1 or 0 is currently stored in memory cell 206), due to a current discharge through memory cell 206. At time $t_1$, the voltage difference between bitlines 214 and 216 reaches a magnitude Δ. The sense amplifier 224 is connected to the bitlines 214 and 216 through column MUX 208 (as selected by column decoder 202 and column enable signal 218). Sense amplifier 224 converts this voltage difference to a 1 or 0 based on the polarity of the difference. After the data from memory cell 206 is read, bitline conditioner 204 precharges the bitlines 214 and 216 back to the high voltage state from times $t_2$ to $t_3$ by supplying a replenishment current to bitline 214.

While the activities above are occurring in memory cell 206, similar events are occurring in each of the other memory cells (not specifically shown) in the row served by wordline 212. When wordline 212 is pulsed high, the voltage on one of the bitlines corresponding to the other memory cells begins to fall (depending on whether a 1 or 0 is currently stored in the memory cell). At time $t_1$, the voltage difference between the bitlines reaches a magnitude Δ. The corresponding bitline conditioners precharge the bitlines back to the high voltage state from times $t_2$ to $t_3$ by supplying a replenishment current to the other bitlines. The sense amplifier 224 remains disconnected from the bitlines of these other memory cells because column MUX 208 has selected bitlines 214 and 216. While all the bitlines associated with memory cells addressed by wordline 212 generate a voltage delta, only the bitlines selected by column MUX 208 are actually used. The other memory cells in the selected row are therefore, by design, are not involved in the data read operation. However, the other bitlines consume additional power during the read operation due to the current discharge and corresponding current replenishment to precharge the bitlines of these other memory cells back to a high voltage state.

One method of reducing the amount of power consumed by the memory device involves shortening the discharge cycle by reducing pulse width of wordline 212 and thereby reducing time $t_1$, and the voltage difference Δ. While this configuration creates less bitline swing and requires less replenishment current, it requires more accurate sense amplifier timing, greater bitline stability, and overall, makes the memory more susceptible to noise and variations of supply voltage, temperature and device characteristics.

The need exists for memory devices that consume less power and that can be implemented efficiently in integrated circuit designs.

DETAILED DESCRIPTION OF THE INVENTION INCLUDING THE PRESENTLY PREFERRED EMBODIMENTS

Various embodiments of the present invention save power in semiconductor memories by applying a decoded source current to SRAM memory cells. A bias current generator retains the latched data for bit cells connected to unselected bit lines. A read generator supplies additional source current to the bit cell that is connected to a selected bitline pair during a read operation. This advantage and other advantages over the prior art will be evident in light of the many functions and features described herein.

Figure 1:
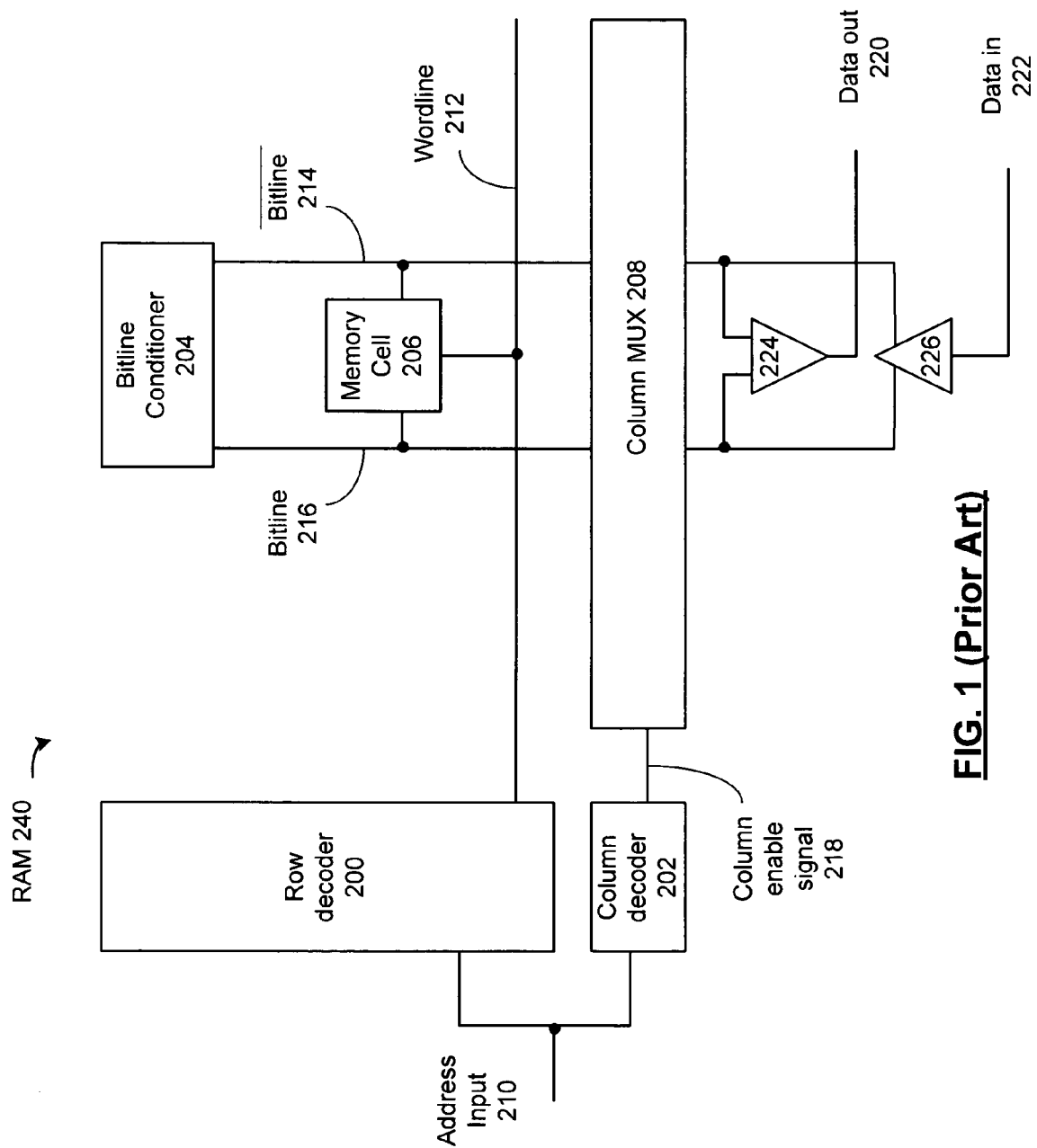
FIG. 1 presents a schematic block diagram representation of a prior art RAM 240.
Figure 2:
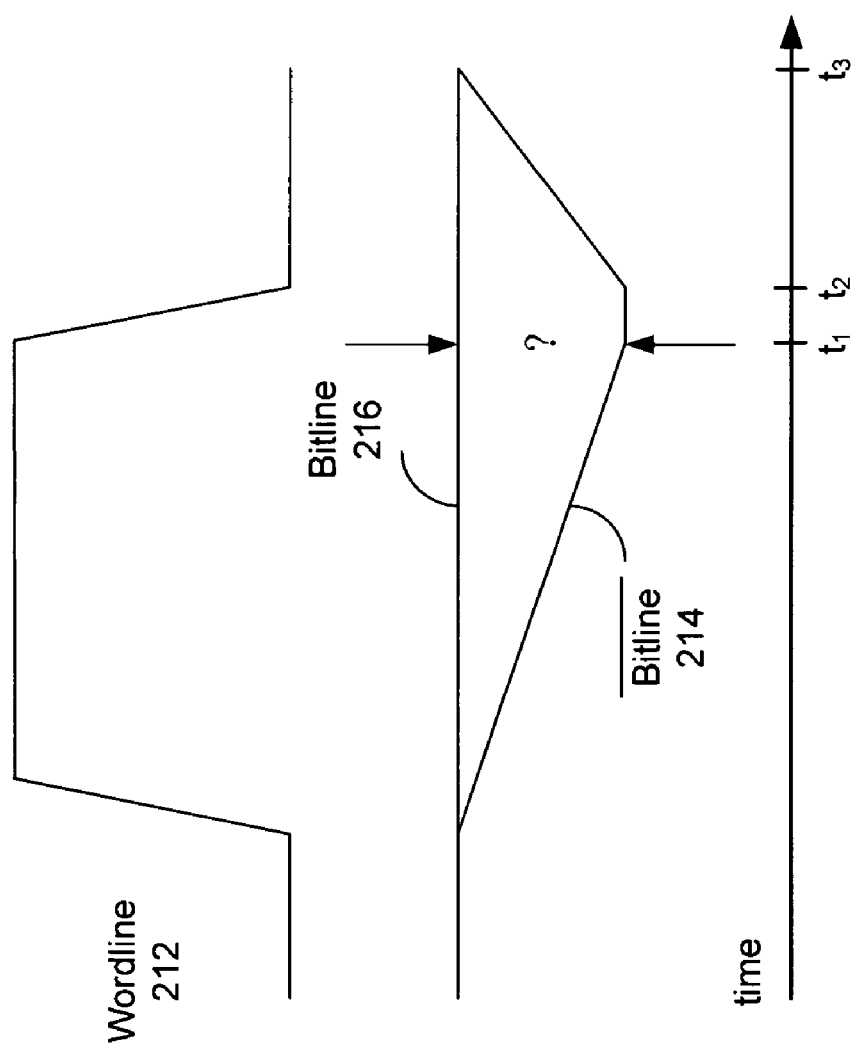
FIG. 2 presents a graphical representation of the voltage of complementary bitlines 214 and 216 in response to a read operation.
Figure 3:
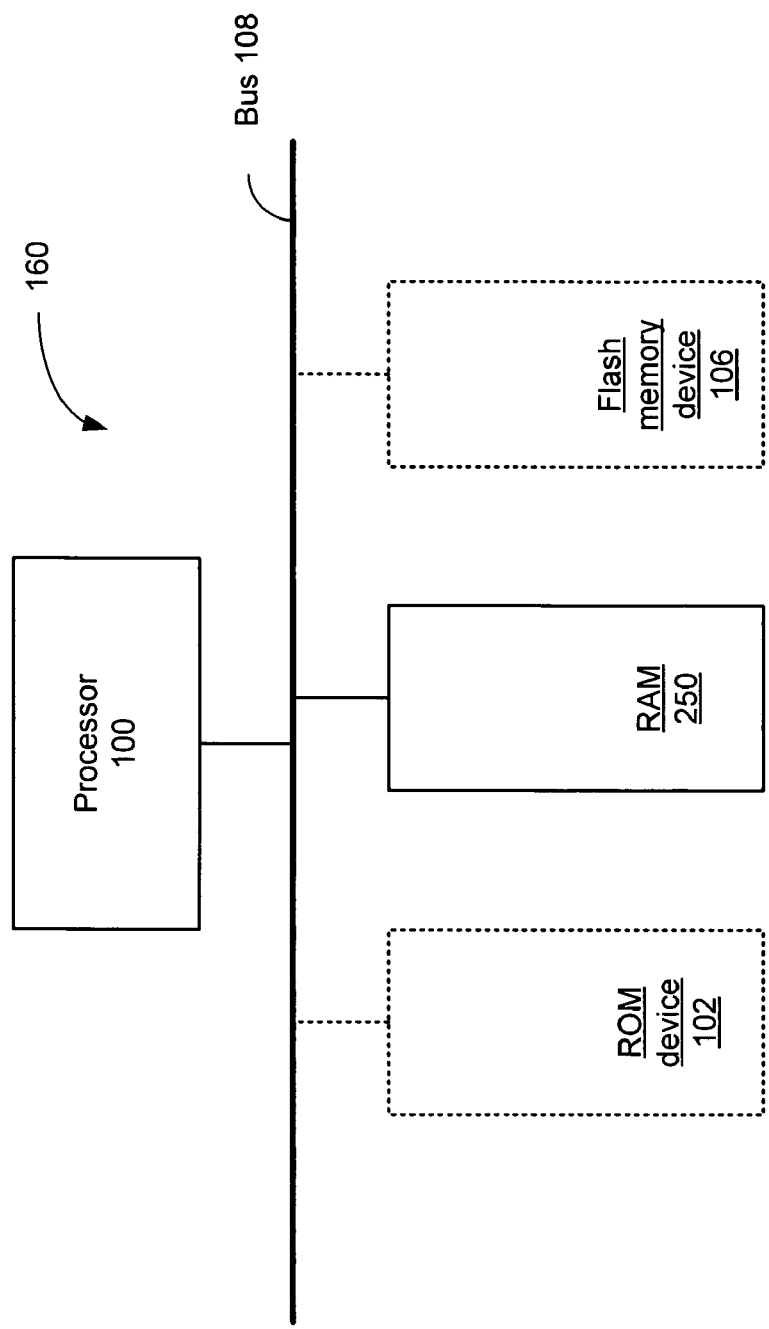
FIG. 3 presents a combination schematic/block diagram representation of a processing system 160 in accordance with an embodiment of the present invention.

FIG. 3 presents a combination schematic/block diagram representation of a processing system 160 in accordance with an embodiment of the present invention. In particular, a processing system 160 is presented that includes a processor 100 that is coupled to optional read only memory (ROM) device 102, random access memory (RAM) 250, and optional flash memory device 106 via bus 108. RAM 250 includes novel power saving features as will be described in further detail in conjunction with the figures that follow.

Figure 4:
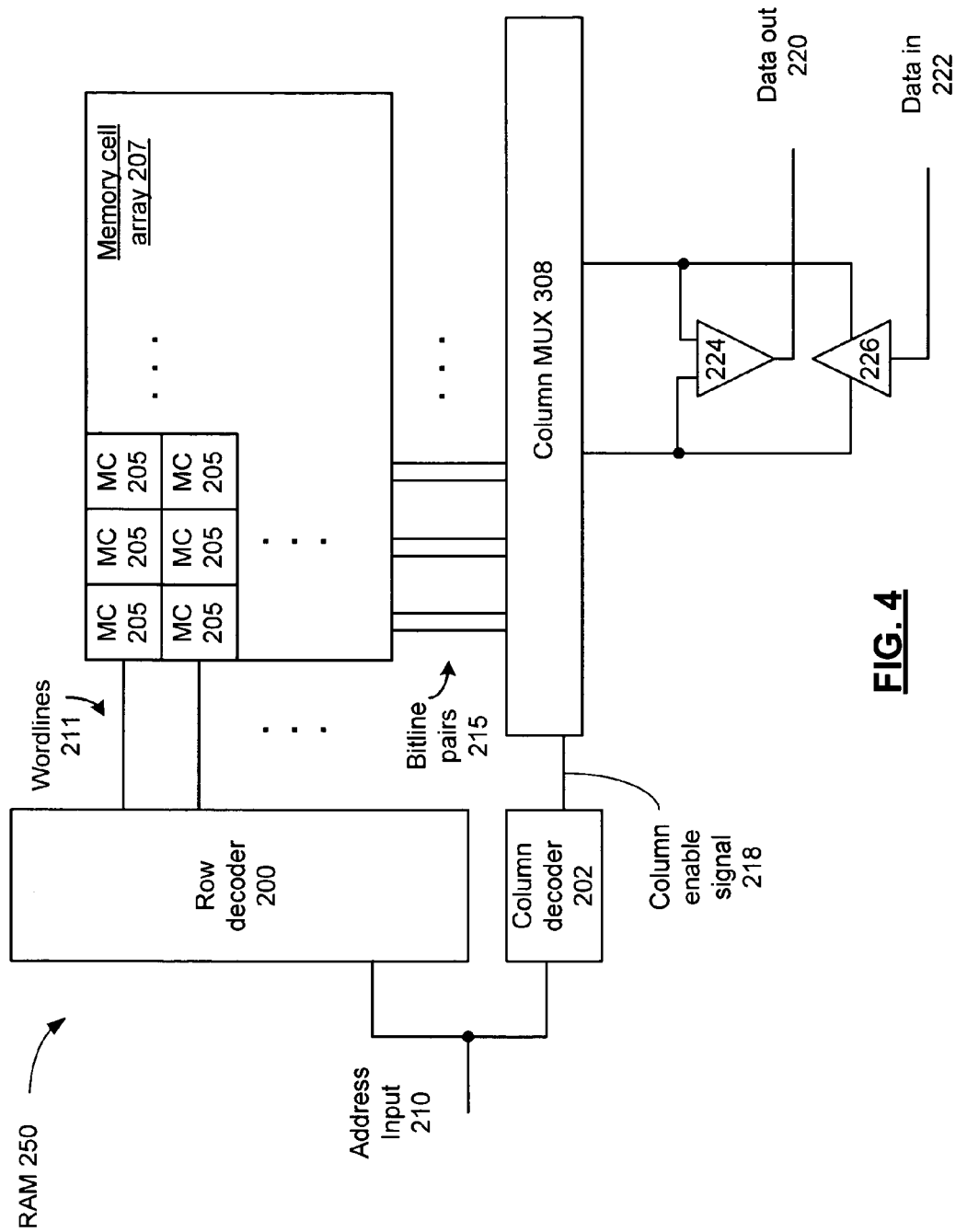
FIG. 4 presents a schematic block diagram representation of a RAM 250 in accordance with an embodiment of the present invention.

FIG. 4 presents a schematic block diagram representation of a RAM 250 in accordance with an embodiment of the present invention. In an embodiment of the present invention, RAM 250 is a static RAM (SRAM) device that includes a memory cell array 207 of individual memory cells 205 that are arranged in a row and column format for ease in binary addressing. Memory cells 205 can be implemented using complementary metal oxide semiconductor (CMOS) transistors, n-channel metal oxide semiconductor (NMOS) transistors, or with other transistors or electrical devices within the broad scope of the present invention. A particular memory cell is accessed by decoding the address 210 with row decoder 200 and column decoder 202. Row decoder 200 selects one of the wordlines 211 that corresponds to the row of memory cells that contains the selected memory cell. Column decoder 202 selects one of the complementary bitline pairs 215 corresponding to the column of memory cells that contains the particular memory cell. Column multiplexer (MUX) 208 couples the selected bitline pair 215 to sense amplifier 224 and data buffer 226. Data are written to individual memory cells from data in line 222 and data buffer 226. Data are read from individual memory cells by sense amplifier 224 and are output on data out line 220.

In an embodiment of the present invention, each memory cell 205 has an associated controller that controls the source current to a read current state when a column containing the memory cell is selected, and controls the source current to a bias current state when the column containing the memory cell is not selected. Further details regarding this controller will be disclosed in conjunction with FIG. 5.

Figure 5:
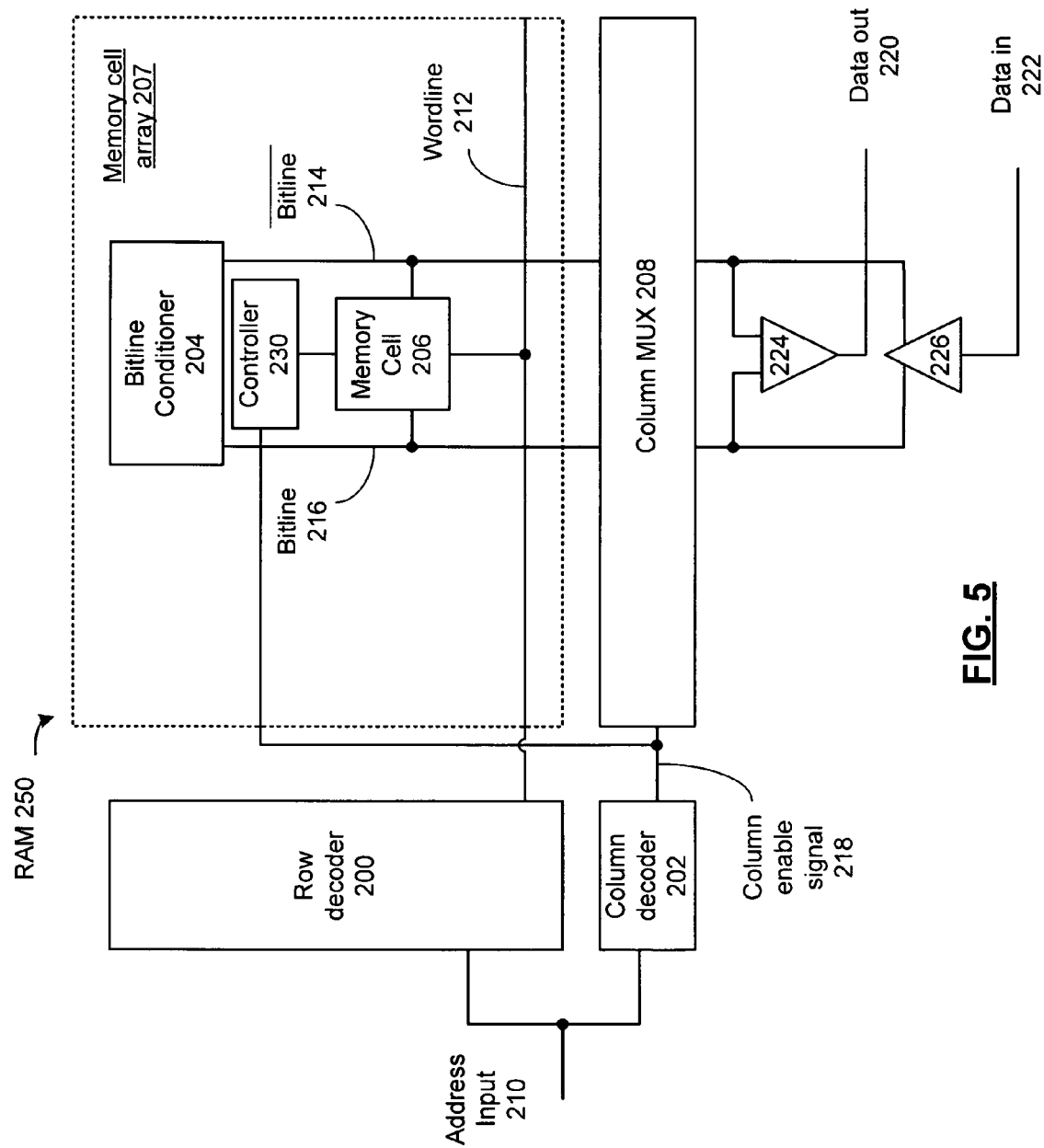
FIG. 5 presents a schematic block diagram representation of a RAM 250 in accordance with an embodiment of the present invention.

FIG. 5 presents a schematic block diagram representation of a RAM 250 in accordance with an embodiment of the present invention. In an embodiment of the present invention, RAM 250 includes a memory cell array 207, however, the configuration of an individual memory cell 206 is shown in greater detail. In particular, RAM 250 includes controller 230 for controlling the source current of a memory cell, such as memory cell 206, in response to column enable signal 218.

In operation, the controller 230, controls the source current to a read current state when a column containing the memory cell is selected, and controls the source current to a bias current state when the column containing the memory cell is not selected. In an embodiment of the present invention, the source current in the read current state is greater than the bias current. Therefore, less power is consumed by memory cell 206, particularly in circumstances where memory cell 206 is part of a row that has been selected by row decoder 200, but is not part of a column that has been selected by column decoder 202. In an embodiment of the present invention, each of the memory cells in RAM 250 include this feature, and therefore, the power savings of the present invention is accumulated over multiple devices.

Figure 6:
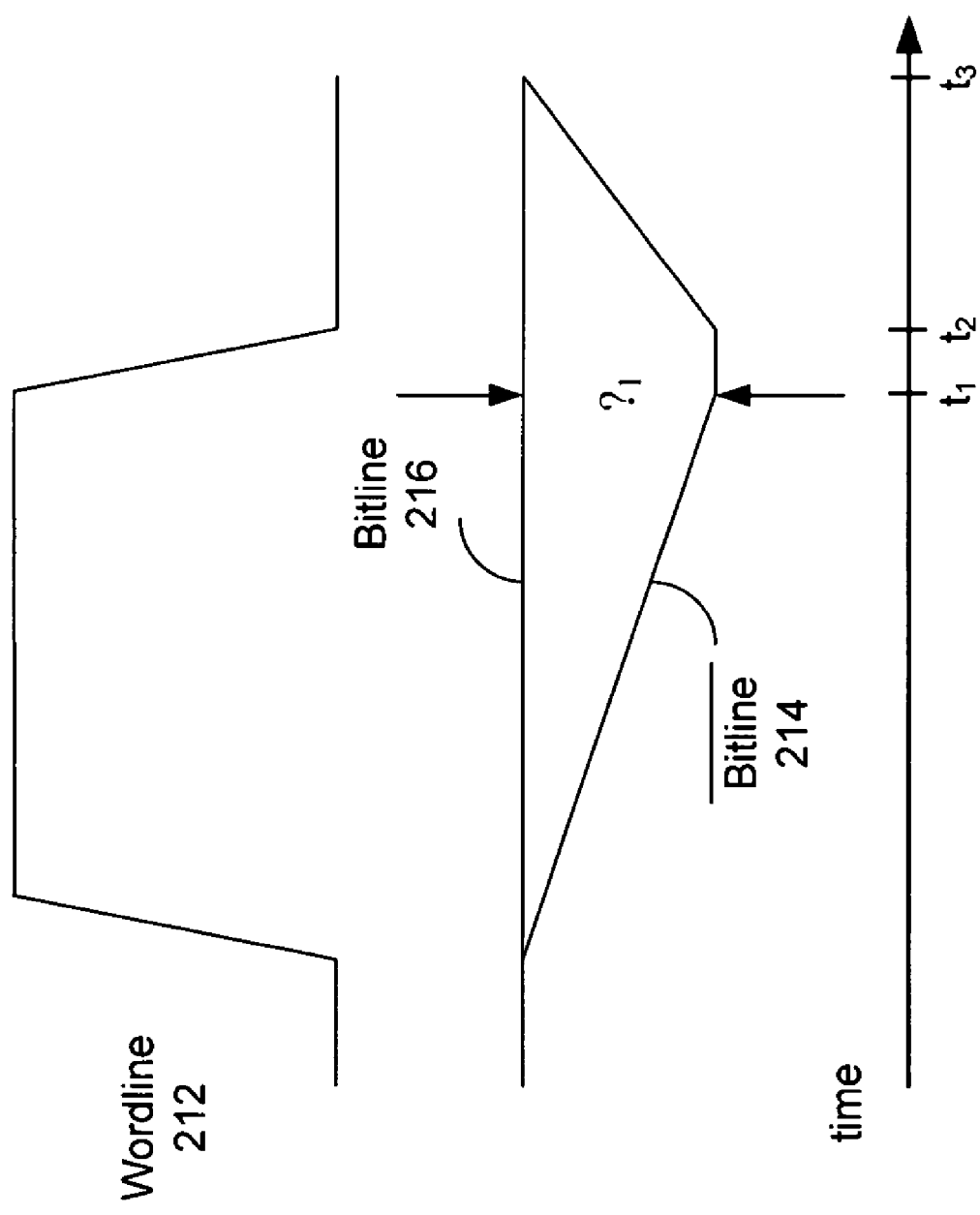
FIGS. 6-7 present a graphical representation of the voltage of bitlines 214 and 216 in response to a read operation in accordance with an embodiment of the present invention.
Figure 7:
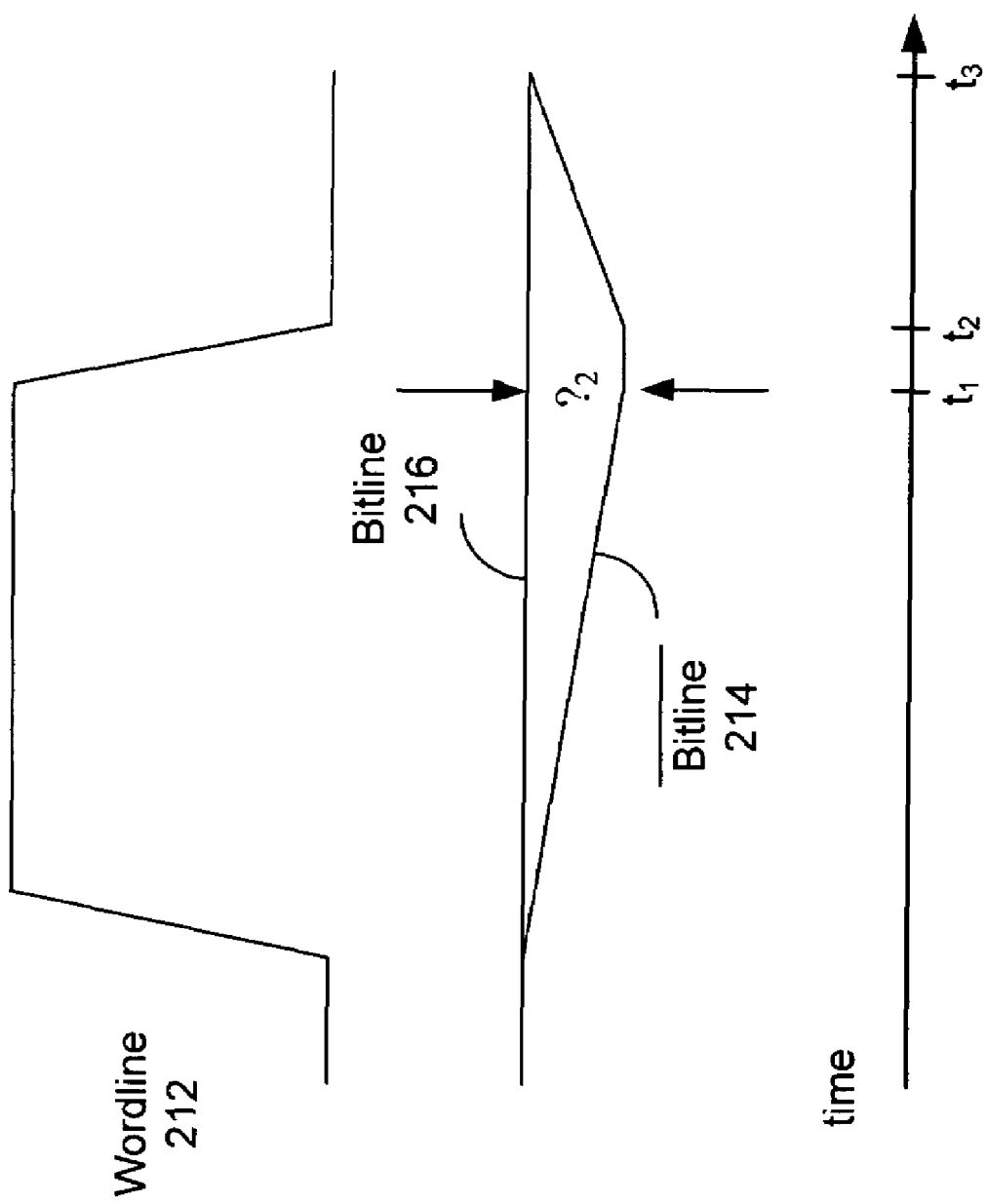

FIGS. 6-7 present a graphical representation of bitlines 214 and 216 in response to a read operation in accordance with an embodiment of the present invention. In particular, FIG. 6 presents the voltages of bitlines 214 and 216 for memory cell 206 when the row and column containing memory cell 206 are selected. FIG. 7 presents the voltages of bitlines 214 and 216 for memory cell 206 when the row containing memory cell 206 is selected, but the column is not selected.

In the case of FIG. 6, the controller 230, controls the source current of memory cell 206 to a read current state because the column containing memory cell 206 is selected. The source current in the read current state is allowed to increase to an amount sufficient to support a read operation of memory cell 206. When wordline 212 is pulsed high, the voltage on one of the bitlines of memory cell 206 begins to fall. In this example, bitline 214 is shown to fall, however, in other circumstances the voltage curves for bitlines 216 and 214 would be reversed (depending on whether a 1 or 0 is currently stored in the memory cell). At time $t_1$, the voltage difference between the bitlines reaches a magnitude $\Delta_1$. Sense amplifier 224 converts this voltage difference $\Delta_1$ to a 1 or 0 based on the polarity of the difference. After the data from memory cell 206 is read, bitline conditioner 204 precharges the bitline 214 back to the high voltage state from times $t_2$ to $t_3$ by supplying a replenishment current to the bitline 214. In summary, the source current of memory cell 206 is controlled to allow normal operation of memory cell 206 during a read or write operation.

FIG. 7 demonstrates a circumstance where the column containing memory cell 206 is not selected. In this case, the controller 230 controls the source current of memory cell 206 to a bias current level. In an embodiment of the present invention, the bias current level is less than the source current level in the read current state. If wordline 212 is pulsed high because another memory cell in the same row as memory cell 206 is being accessed, the voltage on one of the bitlines of memory cell 206 begins to fall. In this example, bitline 214 is shown to fall, however, because the source current of memory cell 206 is controlled to a bias current level that is less than the read current level, the voltage of bitline 214 falls more slowly. At time $t_1$, the voltage difference between the bitlines 214 and 216 reaches a magnitude $\Delta_2$, where $\Delta_1 > \Delta_2$. In an embodiment of the present invention, the bias current is less than the normal read current of the memory cell. In other words, the voltage difference $\Delta_2$ is less than the current used to reliably indicate the binary value stored in memory cell 206. However, the bias current is selected to be sufficient to cause the memory cell 206 to retain the binary value that is currently stored.

The corresponding bitline conditioners precharge the bitlines back to the high voltage state from times $t_2$ to $t_3$ by supplying a replenishment current to the other bitlines. The power required to replenish the bitline 214 or 216, when the column containing memory cell 206 is not selected, is greatly reduced. This results in a power savings from all of the other bitlines in the row that are also not selected, if similarly implemented in accordance with the present invention. In addition, because a reduced value of $\Delta_2$ provides power savings, a greater voltage difference $\Delta_1$ can be used. This greater bit swing allows more relaxed sense timing and simpler implementation of sense amplifier 224.

While the forgoing descriptions are written in terms of a read operation it should be noted that the normal functioning of a write operation is unaffected. The reduced bias current to memory cell 206 saves power during the write mode as well as the read mode. This allows the memory cell 206 to operate normally during read and write operation, but with reduced power as described above.

Figure 8:
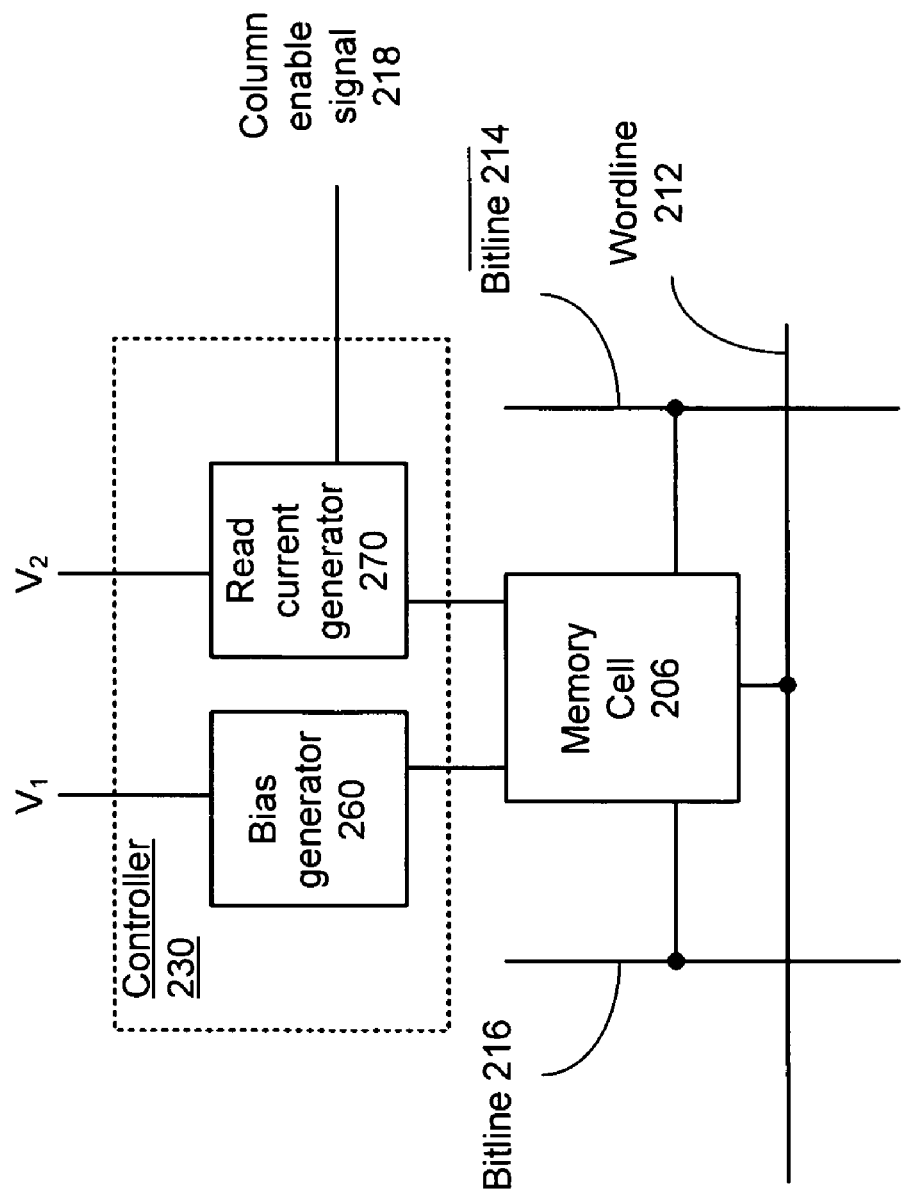
FIG. 8 presents a block diagram representation in accordance with an embodiment of the present invention.

FIG. 8 presents a block diagram representation in accordance with an embodiment of the present invention. In particular, a further structure for controller 230 is presented. In this embodiment, controller 230 includes a bias generator 260, operably coupled to the memory cell 206 and a source voltage (represented as $V_1$), for supplying a bias current to the memory cell 206. In addition, controller 230 includes a read current generator 270, operably coupled to the memory cell 206, the source voltage $V_2$ and to column enable signal 218.

In operation, when the column enable signal 218 indicates that the column containing memory cell 206 has been selected, the source current to the memory cell 206 is controlled to a read current state. In an embodiment of the present invention, the controller acts as a switch (or multiplexer) to connect the source of memory cell 206 to $V_2$ through a low impedance when the bitlines 214 and 216 are connected to sense amplifier 224, and to $V_1$ through a high impedance when the bitlines 214 and 216 are not connected to sense amplifier 224. In this fashion, memory cell 206 is supplied a normal read current to support a read operation from this memory cell. However, if memory cell 206 is not connected to the sense amplifier 224 through bitlines 214 and 216, the high impedance connection of $V_1$ to the source of memory cell 206 restricts the flow of current to memory cell 206 to a current level that is less than a normal read current, consuming less power, but still retaining the bit data.

In an embodiment of the present invention, the source voltages $V_1$ and $V_2$ are voltages such as Vss or a bias voltage that is slightly above Vss. Further, while the bias generator 260 and the read current generator 270 are shown as being coupled to separate voltages, a single source voltage may likewise be used for these two elements. Therefore, sources voltages $V_1$ and $V_2$ may be equal or different voltages. While the source current to memory cell 206 is shown as emanating from voltage sources $V_1$ and $V_2$, other configuration including current sources, current generators connected to positive voltages, negative voltages or coupled to ground, are similarly possible, depending on the many possible structures for memory cell 206, as will be understood by one skilled in the art when presented the teachings disclosed herein.

Figure 9:
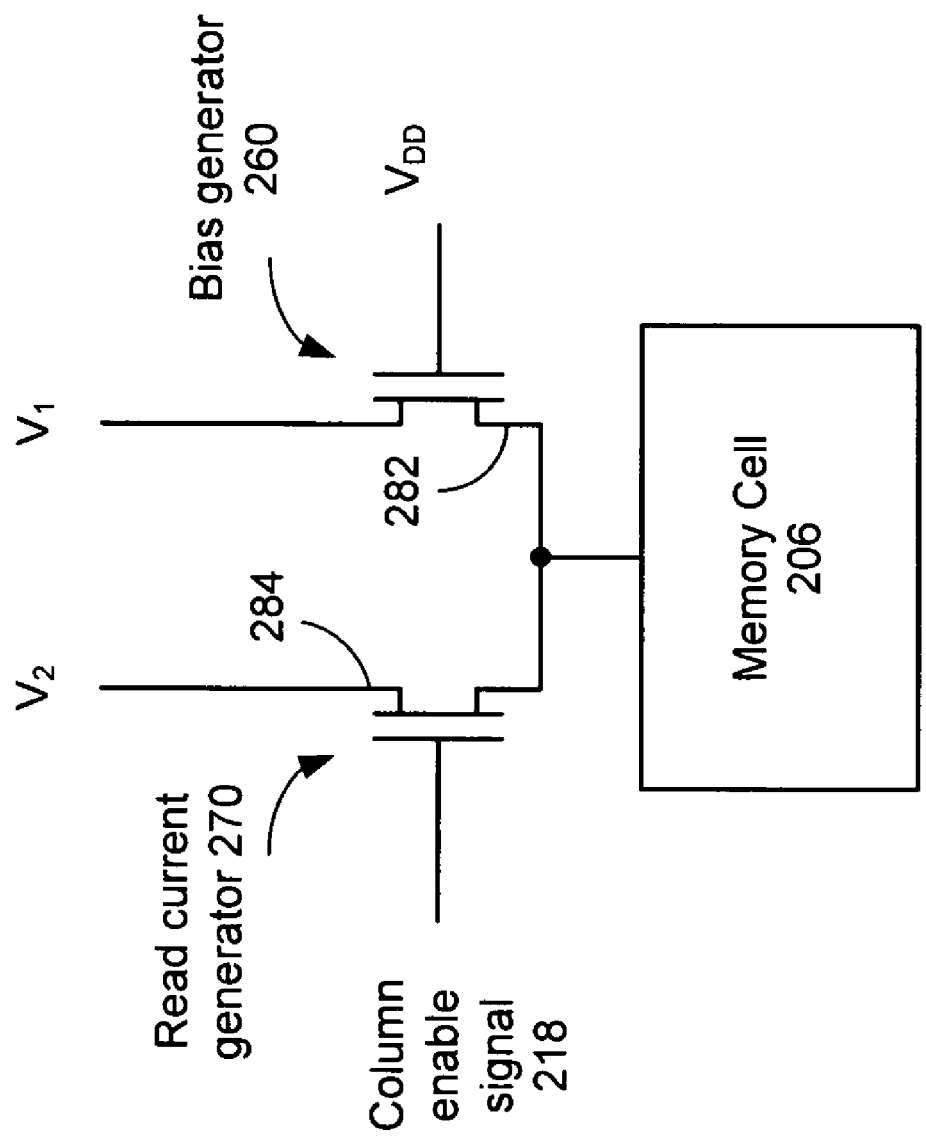
FIG. 9 presents a block/schematic representation in accordance with an embodiment of the present invention.

FIG. 9 presents a block/schematic representation in accordance with an embodiment of the present invention. In particular, a possible circuit implementation of read current generator 270 and bias generator 260 is presented. In this embodiment, bias generator 260 is implemented with an n-channel metal oxide semiconductor (NMOS) transistor 282 that has a gate voltage of $V_{DD}$ or some other voltage, that can be a regulated voltage that turns on transistor 282. Transistor 282 serves to supply a bias current to memory cell 206. Further, transistor 282 serves to limit the source current to memory cell 206 in order to reduce the power consumption of memory cell 206. When the column containing memory cell 206 is not selected, the bias current (that is less than the read current required to support normal read operations of memory device 206) slows the rate of discharge of the bitlines, and as a result, requires less replenishment current to precharge bitline 214 or 216. When the column enable signal 218 goes high, indicating that memory cell 206 has been selected, n-channel metal oxide semiconductor (NMOS) transistor 284 turns on to control the current to memory cell 206 to the read current state. In particular, transistor 284 provides a low impedance connection to $V_2$ that supplies an additional source current which, when combined with the bias current generated by transistor 282, is sufficient to support a normal read operation of the memory cell 206.

Figure 10:
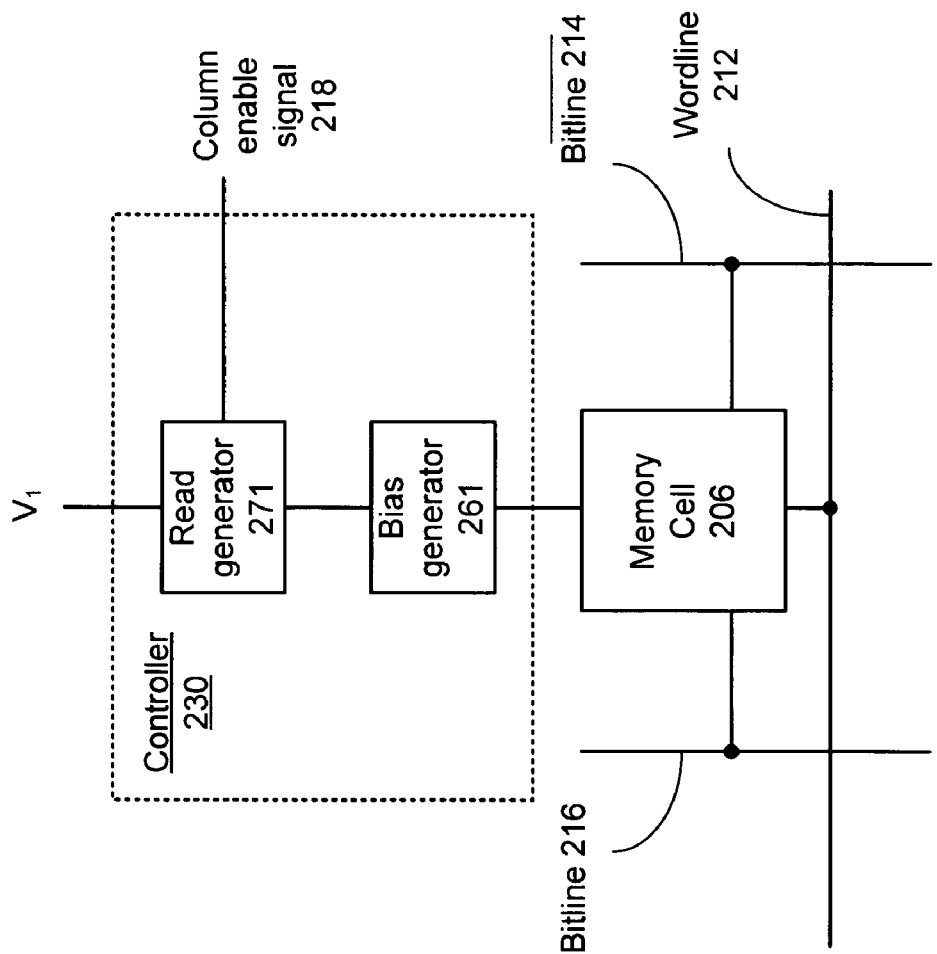
FIG. 10 presents a block diagram representation in accordance with an embodiment of the present invention.

FIG. 10 presents a block diagram representation in accordance with an embodiment of the present invention. In particular, an alternative structure for controller 230 is presented. In this embodiment, controller 230 includes a bias generator 261, operably coupled to the memory cell 206 for supplying a bias current to the memory cell 206. In addition, controller 230 includes a read current generator 271, operably coupled to the bias generator 260, the source voltage $V_1$ and to column enable signal 218. In operation, when the column enable signal 218 indicates that the column containing memory cell 206 has been selected, the source current to the memory cell 206 is controlled to a read current state by boosting the source voltage to bias generator 261 and memory cell 206. Considering an example when the source voltage $V_1$ is virtual ground (0 Volts), read current generator 230 applies a boosted negative voltage, such as −0.5 Volts, through a low impedance path to memory cell 206.

While the source current to memory cell 206 is shown as emanating from voltage source $V_1$, other configuration including current sources, current generators connected to positive voltages, negative voltages or coupled to ground, are similarly possible, depending on the many possible structures for memory cell 206, as will be understood by one skilled in the art when presented the teachings disclosed herein. In this fashion, the boost voltage discussed above may be any voltage of sufficient magnitude and polarity to support a proper read operation of memory cell 206.

Figure 11:
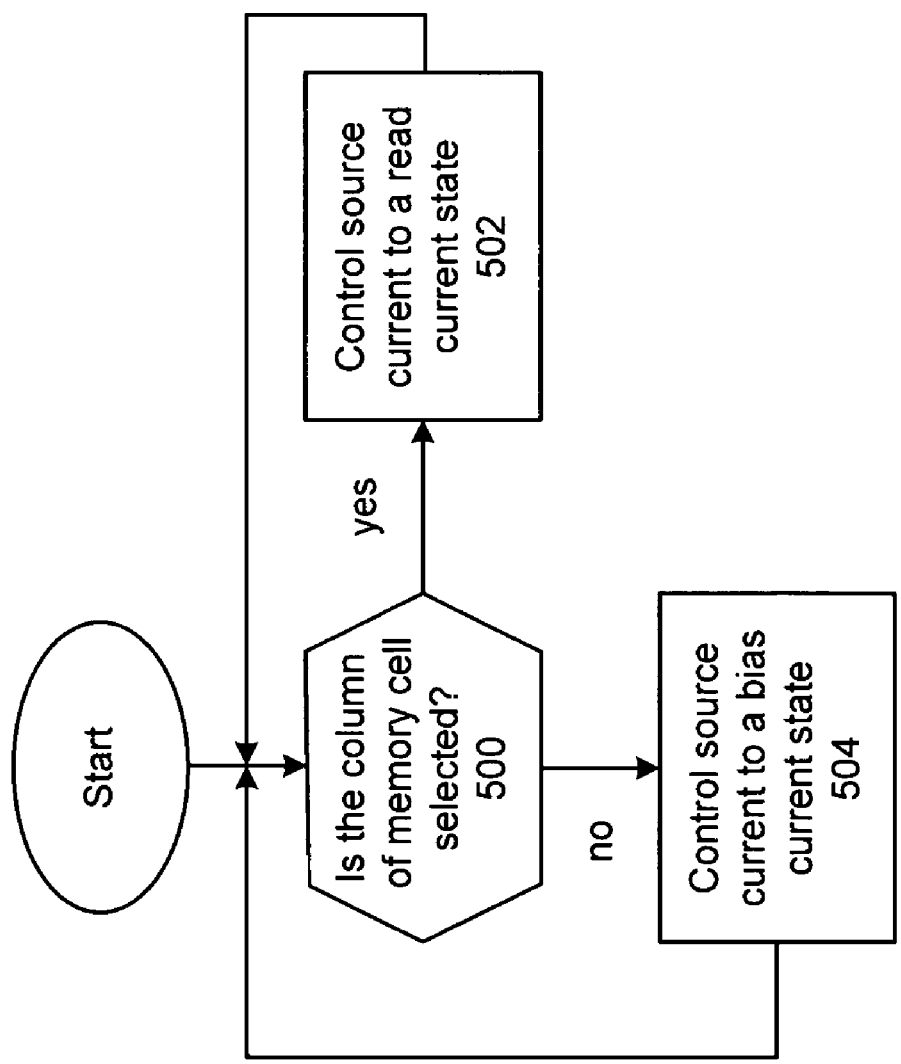
FIG. 11 presents a flowchart representation of a method in accordance with an embodiment of the present invention.

FIG. 11 presents a flowchart representation of a method in accordance with an embodiment of the present invention. In particular a method is presented for use in controlling the source current of a memory cell of a static random access memory (SRAM). In addition to the disclosure below, the method disclosed includes the various features, functions and alternatives as described in conjunction with FIGS. 3-9.

The method begins in step 500 by determining if the column containing the memory cell has been selected. If yes, the method proceeds to step 502 by controlling the source current to a read current state. If no, the method proceeds to step 504 by controlling the source current to a bias current state—until the column containing the memory cell has been selected, at some later time.

Figure 13:
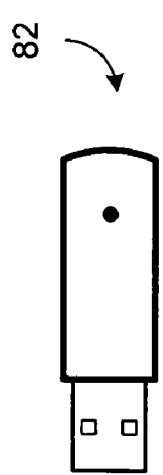
FIG. 12-14 present pictorial diagrams of various devices in accordance with an embodiment of the present invention.
Figure 14:
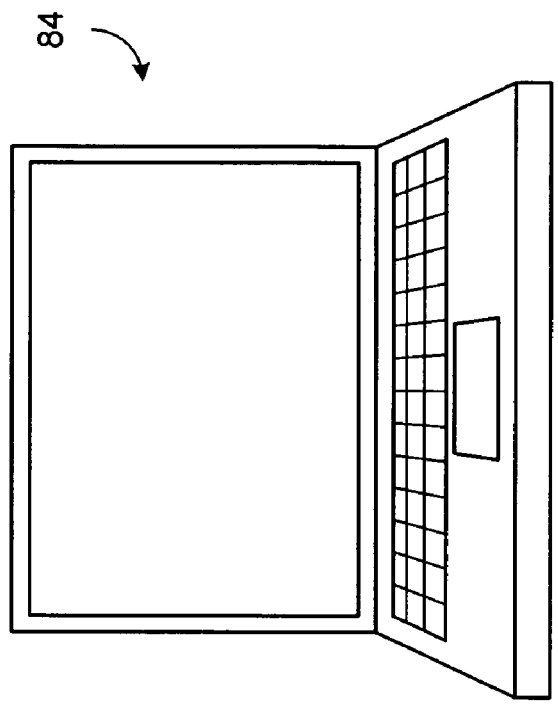
Figure 12:
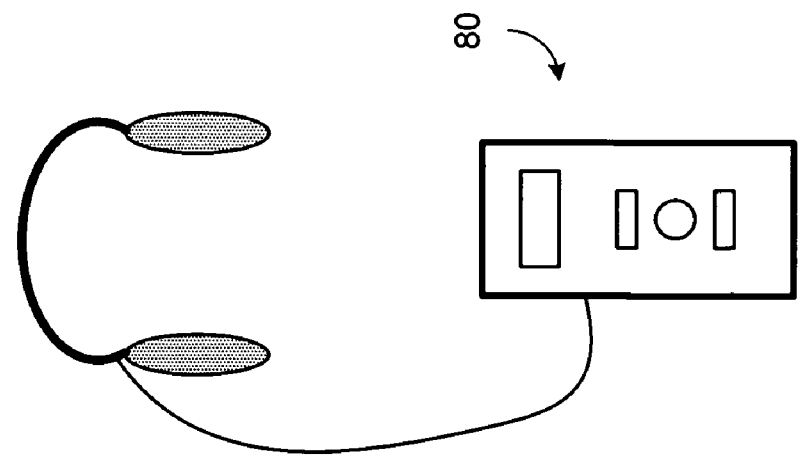

FIG. 12-14 present pictorial diagrams of various devices in accordance with an embodiment of the present invention. While the preceding disclosure has been directed to a RAM 250 used in conjunction with a processing system 160, in an embodiment of the present invention, RAM 250 may be implemented by itself in an integrated circuit such as a memory chip. While implemented as a memory chip, as part of a processing system 160 or as part of a system on a chip integrated circuit, RAM 250 can be used in a wide variety of electronic devices such as handheld audio system 80, universal service bus (USB) device 82, in computer 84, or in a variety of other electronic devices that employ memory devices.

The various processors disclosed herein can be implemented using a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The various circuit components can be implemented using 0.35 micron or smaller CMOS technology. Provided however that other circuit technologies, both integrated or non-integrated, may be used within the broad scope of the present invention. Likewise, various embodiments described herein can also be implemented as software programs running on a computer processor. The various circuits and methods consume less power and that can be easily and efficiently implemented in various integrated circuit designs. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a controller for controlling the source current to a memory cell, and a processing system. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A controller for controlling a source current of a memory cell for use in a static random access memory (SRAM), the controller comprising:
   a bias generator, operably coupled to the memory cell and a source voltage, for supplying a bias current to the memory cell; and
   a read current generator, operably coupled to the memory cell and the source voltage, for controlling the source current to the memory cell to a read current state when a column containing the memory cell is selected by connecting the memory cell to one of: a boosted negative voltage and the source voltage, through a low impedance path.

2. The controller of claim 1 wherein the bias current is less than a normal read current.

3. The controller of claim 1 wherein the memory cell stores a binary value and wherein the bias current is sufficient to retain the binary value.

4. The controller of claim 1 wherein the read current generator includes a first transistor coupled to a column enable signal.

5. The controller of claim 4 wherein the first transistor is an n-channel metal oxide semiconductor (NMOS) transistor.

6. The controller of claim 4 wherein the first transistor turns on in response to the column enable signal.

7. The controller of claim 1 wherein the source current in the read current state is greater than the bias current.

8. The controller of claim 1 wherein the bias generator includes a second transistor.

9. The controller of claim 8 wherein the second transistor is an n-channel metal oxide semiconductor (NMOS) transistor.

10. A processing system comprising:
    a processor,
    static random access memory (SRAM) device, operably coupled to the processor, the SRAM device including:
    a plurality of memory cells;
    a column decoder for generating a column enable signal in response to an address input, the address input containing an address of a selected memory cell of the plurality of memory cells;
    a row decoder, operably coupled to the plurality of memory cells and the address input, for activating a selected row of the plurality of memory cells that contains the selected memory cell;
    a column multiplexer, operably coupled to the plurality of memory cells and the column decoder, for activating a selected column of the plurality of memory cells that contains the selected memory cell;

a data input, operably coupled to the column multiplexer, for writing data to the selected memory cell when a write command is received;

a sense amplifier, coupled to the column multiplexer for reading data from the selected memory cell when a read command is received;

a bias generator, operably coupled to the selected memory cell and a source voltage, for supplying a bias current to the selected memory cell; and a read current generator, operably coupled to the selected memory cell and the source voltage, for controlling the source current to a read current state when the selected column of the plurality of memory cells containing the selected memory cell is activated by connecting the selected memory cell to one of: a boosted negative voltage and the source voltage, through a low impedance path.

11. The processing system of claim 10 wherein the bias current is less than a normal read current, wherein the selected memory cell stores a binary value and wherein the bias current is sufficient to retain the binary value.

12. The processing system of claim 10 wherein the read current generator includes a first transistor coupled to the column enable signal.

13. The processing system of claim 12 wherein the first transistor is an n-channel metal oxide semiconductor (NMOS) transistor.

14. The processing system of claim 12 wherein the first transistor turns on in response to the column enable signal.

15. The processing system of claim 10 wherein the source current in the read current state is greater than the bias current.

16. The processing system of claim 10 wherein the bias generator includes a second transistor.

17. The processing system of claim 16 wherein the second transistor is an n-channel metal oxide semiconductor (NMOS) transistor.

18. A method for use in controlling a source current of a memory cell of a static random access memory (SRAM), the method comprising:

controlling the source current to a read current state when a column containing the memory cell is selected by connecting the memory cell to one of: a boosted negative voltage and a source voltage, through a low impedance path; and controlling the source current to a bias current state when the column containing the memory cell is not selected.

19. The method of claim 18 wherein the step of controlling the source current to the memory cell to a read current state includes turning on a first transistor in response to a column enable signal, the first transistor coupled to the memory cell and a source voltage.

20. The method of claim 18 wherein the source current in the read current state is greater than the source current in the bias current state.

21. The method of claim 18 wherein the bias current is less than a normal read current.

22. The method of claim 18 wherein the memory cell stores a binary value and wherein the bias current is sufficient to retain the binary value.

* * * * *